United States Patent
Meyer-Fredholm

(10) Patent No.: US 6,669,778 B2
(45) Date of Patent: Dec. 30, 2003

(54) PREPARATION OF CRYSTALS

(75) Inventor: Michele M. L. Meyer-Fredholm, Avon (FR)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 10/107,283

(22) Filed: Mar. 26, 2002

(65) Prior Publication Data

US 2002/0189527 A1 Dec. 19, 2002

(30) Foreign Application Priority Data

Mar. 29, 2001 (FR) .............................. 01 04232

(51) Int. Cl.⁷ .............................................. C30B 13/14
(52) U.S. Cl. .............................. 117/81; 117/70; 117/83
(58) Field of Search ................................. 117/70, 81, 83

(56) References Cited

U.S. PATENT DOCUMENTS

| 5,911,824 | A | 6/1999 | Hammond et al. | |
| 6,061,174 | A | 5/2000 | Shiozawa et al. | |
| 6,093,245 | A | 7/2000 | Hammond et al. | ......... 117/200 |
| 6,200,385 | B1 | 3/2001 | Swinehart | |
| 6,375,551 | B1 | 4/2002 | Darcangelo et al. | |

FOREIGN PATENT DOCUMENTS

| EP | 0 919 646 A1 | 6/1999 |
| EP | 0 995 820 A1 | 4/2000 |
| JP | 10-279396 | 10/1998 |
| JP | 10-330192 | 12/1998 |
| JP | 2000-211999 | 8/2000 |

*Primary Examiner*—Felisa Hiteshew
(74) *Attorney, Agent, or Firm*—Walter M. Douglas

(57) ABSTRACT

The object of the present invention is a process of preparing a crystal, which comprises: loading a crucible with a mixture of the appropriate starting material which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, recovering said crystal; and which is characterized in that the oxide(s) resulting from the reaction between said fluorinating agent(s) and said oxide(s), the impurity or impurities, can be discharged from said crucible, in view of the dimensions of said crucible and of the intrinsic permeability of the material constituting it. Said process is particularly adapted for preparing (mono)crystals of $CaF_2$ in graphite crucibles.

23 Claims, No Drawings

PREPARATION OF CRYSTALS

This application claims the benefit of French Application No. 01 04232, filed Mar. 29, 2001 entitled "Preparation of (mono)Crystal," by M. Meyer-Fredholm.

BACKGROUND OF THE INVENTION

The present invention relates generally to the preparation of fluoride crystals, and particularly to making of optical fluoride crystals with improved below 200 nm wavelength optical properties.

More specifically, said invention relates:

to a process of preparing (mono)crystals, which is improved with reference to the purity of the (mono) crystals prepared; and to a process of preparing (mono)crystals which have an increased transmission in the far-ultraviolet ($\lambda<193$ nm, even $\lambda<157$ nm).

TECHNICAL BACKGROUND

Ultra-high performance optical systems are required in order to increase the density of integration of the electronic components on a semi-conductor plate and insofar as exposed light of low wavelength (lower than 248 nm) is necessary in order to improve the resolution. The most common technique up to now for obtaining such optical systems uses molten silica. According to another technique, which is already exploited, especially by the companies Bicron and Schott, monocrystals of calcium fluoride and monocrystals of barium fluoride are used. Ultra-high performance far-ultraviolet optical systems with below 200 nm wavelengths require fluoride optical crystals.

Said monocrystals, of calcium fluoride or of barium fluoride, and more generally of alkali metal and/or alkaline-earth metal fluorides, are in principle obtained according to the process known as the Stockbarger-Bridgman process, which is familiar to the person skilled in the art. According to said process, the crystal is generated from an appropriate molten starting material in slowly lowering (generally at a speed between 0.3 and 5 mm/h, more generally between 1 and 3 mm/h) a crucible (or a stack of crucibles) containing said molten material through a solidification zone which is provided in an oven. The crucible(s) is (are) made from a material which is resistant to chemical attack from the material that it contains. In general, it is (a) crucible(s) in graphite of high purity.

According to the teaching of U.S. Pat. Nos. 5,911,824 and 6,093,245, the graphite does have the drawback of being porous (of being a material having open porosity), and it is recommended to coat the internal walls of such graphite crucibles with an appropriate internal coating, in order to <<block the porosity>> of said walls. Carbon coatings, especially pyrolytic or vitreous carbon coatings, are described.

The (mono)crystals must imperatively be prepared in the absence of water, of air and of any other source of oxygen. They are thus generally prepared under vacuum in the presence of a fluorinating agent. Said fluorinating agent ensures the elimination of oxygen, especially of that introduced in the form of oxide as impurity in the starting material. $PbF_2$ is the most utilised fluorinating agent, insofar as its manipulation does not present any particular difficulty, insofar as it is solid at ambient temperature and insofar as it has, itself and its corresponding oxide (PbO), a high vapour pressure at the temperatures of use of crystallisation ovens.

Said $PbF_2$ acts, within the context of the preparation of $CaF_2$ crystals, notably according to the reaction:

$$CaO + PbF_2 \rightarrow CaF_2 + PbO.$$

In practice, it is always delicate to optimise the intervention of said fluorinating agent. It is especially critical:

to adjust the rise in temperature of the mixture (for its melting) with the view to said optimisation;

to adjust the amount of said fluorinating agent, with the view to minimising any retention of Pb or other (according to the nature of said fluorinating agent in question) in the crystal prepared: such a retention has obviously disadvantageous repercussions on the performances of transmission and resistance to radiation of said crystal.

It is, within the context set forth above, with reference to the optimisation of the intervention of fluorinating agents, that the present invention has been developed.

SUMMARY OF THE INVENTION

One aspect of the invention relates to a process of preparing a fluoride optical crystal which includes loading a crucible with a mixture of a fluoride optical crystal starting material which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, and recovering said crystal wherein the oxide(s) resulting from the reaction between said fluorinating agent(s) and said oxide(s), the impurity or impurities, can be discharged from said crucible, in view of the crucible and the intrinsic permeability of the material constituting it.

In another embodiment, the present invention includes a method of making an optical fluoride crystal with increased far-ultraviolet transmission by providing a fluoride crystal producing graphite crucible for containing the fluoride, said graphite crucible comprised of a graphite having a permeability of which, measured according to the DIN 51935 Standard, is greater than 4 $cm^2/s$, forming a molten fluoride melt in said graphite crucible comprised of said graphite having a permeability greater than 4 $cm^2/s$ and forming a fluoride crystal from said molten fluoride melt, said formed fluoride crystal having an increased far-ultraviolet transmission with intrinsic transmission at 157 nm>99%. In a preferred embodiment the fluoride crystal comprises calcium fluoride. In a preferred embodiment the fluoride crystal comprises barium fluoride.

In another embodiment, the present invention includes an optical fluoride crystal producing graphite crucible for making an optical fluoride crystal with increased far-ultraviolet transmission, said graphite crucible comprised of a graphite having a permeability of which, measured according to the DIN 51935 Standard, is greater than 4 $cm^2/s$.

Additional features and advantages of various embodiments of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

The process of preparing a crystal of the invention comprises:

loading a crucible with a mixture of the appropriate starting material which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, and recovering said crystal.

In this, it can be a Stockbarger-Bridgman process, or any other equivalent process, each of the steps of which is familiar to the person skilled in the art, which is thus carried out in order to obtain a mono- or polycrystalline crystal.

Thus, in order to prepare (mono)crystals of $CaF_2$, said crucible is in general loaded with a mixture de synthetic $CaF_2$ powder, which contains CaO as impurity, and $PbF_2$ (fluorinating agent).

The crucible in question can very well not be a single one. The process of the invention can effectively be carried out, just as the process of the prior art, with a stack of n crucibles, which is moved with a translatory motion along its vertical axis.

The fluorinating agent(s) which is (are) incorporated is (are) not incorporated in an excess amount. In this way, it (they) cannot pollute the crystals prepared.

Characteristically, within the context of the invention, the oxide(s) (PbO, in the context specified above (in a purely illustrative manner) of preparation of (mono)crystals of $CaF_2$) resulting from the reaction between said fluorinating agent(s) ($PbF_2$) and said oxide(s), the impurity or impurities (CaO), can be discharged from said crucible, in view of the dimensions of said crucible and of the intrinsic permeability of the material constituting it.

The crucible(s) which intervene(s) for carrying out the process of the invention is (are) optimised, as to its (their) size and its (their) intrinsic permeability, such that the crystals prepared no longer contain—in any case, less than 0.1 ppm—any element corresponding to the formulation of the fluorinating agents (element Pb, in the context specified above (in a purely illustrative manner) of preparation of (mono)crystals of $CaF_2$, with intervention of $PbF_2$ as fluorinating agent).

Within the context of the process of the invention, the fluorinating agent (even the fluorinating agents) acts (act) and leave no trace. By virtue of its (their) controlled amount of intervention (effective and non-excess amount) and the original characteristics of the crucible employed, the fluorinating agent(s) react and the reaction products can discharge totally. There is thus no pollution of the crystals prepared.

In a non-obvious manner, within a context of optimisation of the intervention of the fluorinating agent(s), the inventors:

have demonstrated that the means of implementation of the temperature rise cycle (with the view to obtaining melting of the starting material) did not constitute the determining factor of the purity (with reference to the fluorinating agent incorporated) of the crystals prepared;

have demonstrated that the purity of the material constituting the crucible was not directly responsible;

have clearly established a correlation between the intrinsic permeability of the crucible and the purity of the crystals prepared in said crucible. The more permeable the material constituting the crucible is, the less pollutant (introduced by the fluorinating agent(s) incorporated) is found in the crystals prepared. Obviously, the permeability of said crucible remains within a reasonable limit in order that the molten mixture be retained, in a stable manner, in said crucible.

The correlation established was, a priori, in no way obvious, and is entirely against the teaching of U.S. Pat. Nos. 5,911,824 and 6,093,245 set forth further up in the present text.

The permeability of a porous material (in this case of the crucibles used, which are in general graphite crucibles) is a parameter which is perfectly defined by the DIN 51935 Standard: 1993-08 (entitled "Determination of the coefficient of permeability by means of the vacuum—decay method with air as experimental gas"), which is familiar to the person skilled in the art. Said permeability, which is generally expressed in $cm^2/s$, is in fact the resultant of several factors which relate to the porosity, such as:

the size of the pores, their distribution within the mass, the fact that they unblock or not in a given proportion.

Characteristically, the process of the invention thus enables very pure crystals to be prepared (less than 0.1 ppm of contaminant in general, and especially less than 0.1 ppm of Pb when $PbF_2$ is used as fluorinating agent), insofar as the discharging of the impurities, which are generated following the intervention of the fluorinating agents, is mastered perfectly. The mastering of this discharging is based jointly on the dimensions of the crucible in question (said dimensions are inevitably limited such that the vapours have the possibility of diffusing (and of being discharged) within the molten material before its crystallisation (its solidification) and on the permeability of the material constituting said crucible. The vapours in question (PbO, in the context specified above (in a purely illustrative manner) of preparation of (mono)crystals of $CaF_2$, with intervention of $PbF_2$ as fluorinating agent) diffuse within the molten material and discharge through the permeable walls of the crucible and through the surface of said molten material.

Mention has been made of the intervention of an effective and non-excess amount of at least one fluorinating agent which is solid (at ambient temperature). In general, one sole such agent intervenes. It is however in no way excluded from the context of the invention that several of them intervene.

With reference to said effective and non-excess amount, it is indicated in a totally non-limiting way that said amount is rarely greater than 5% by weight of the starting material which intervenes, that it is advantageously between 0.1 and 2% by weight of said starting material.

With reference to the nature of said fluorinating agent(s), it is specified in the same way, i.e. in a totally non-limiting manner, that said fluorinating agent(s) is (are) selected from: $PbF_2$, $ZnF_2$, $NH_4F$, $NH_4F.HF$, PTFE (polytetrafluoroethylene: Teflon®), and mixtures thereof. It has already been seen, in the introduction of the present text, that $PbF_2$ is the most used fluorinating agent up to now. Its intervention is particularly recommended within the context of the present invention.

In a preferred alternative embodiment of the invention, the high permeability graphite crucible that are comprised of graphite having a DIN Standard (DIN 51935) greater than 4 $cm^2/s$ are utilized in conjunction with a gaseous fluorinating agent such as $CF_4$. Within the context of a preferred embodiment of the process of the invention, the crucible(s) which intervene(s) is (are) graphite crucible(s) the permeability of which, measured in accordance with the DIN Standard identified above (DIN 51935), is greater than 4 $cm^2/s$. Within the context of a particularly preferred variant, said crucible(s) is (are) in a graphite, the permeability of which, in accordance with the same Standard, is greater than 10 $cm^2/s$.

Generally, the intervention is recommended, in the process of the invention, of crucibles which are suitable for preparing crystals which have the following dimensions:

200 mm diameter, for 50 mm height, 300 mm diameter, for 80 mm height.

The intervention is particularly recommended of such graphite crucibles, the permeability of which is as indicated above.

The material constituting the crucibles used is not forced to be graphite, but, obviously, said material is adapted to the constraints of the process carried out within it (presence of corrosive products, high temperatures . . . ).

In any case, the pollutant oxide(s) generated during the crystallisation within the crystallisation crucible is (are), according to the invention, capable of being discharged from said crucible, by virtue of the dimensions of said crucible and the permeability of the material constituting it (them).

The process of the invention is particularly suitable for preparing (mono)crystals of alkali metal and/or alkaline-earth metal fluorides. It enables the preparation of (mono) crystals, which are very pure, of alkali metal or alkaline-earth metal fluorides, and even the preparation of mixed (mono)crystals of fluorides of alkali metals and/or alkaline-earth metals, which are very pure, (mixtures of at least two alkali metals, of at least two alkaline-earth metals or of at least one alkali metal and at least one alkaline-earth metal).

In accordance with the invention, (mono)crystals of fluorides have been prepared of high optical quality; especially (mono)crystals of calcium and barium fluorides which have, at the wavelengths (λ) indicated below, the intrinsic transmissions ($T_i$) specified below:

≦193 nm, $T_i$≧99.9% and

≦157 nm, $T_i$≧99.0%.

Such monocrystals have obvious potential in laser and lithography industries.

The process of the invention is more particularly suitable for preparing (mono)crystals of calcium fluoride ($CaF_2$).

The process of the invention is advantageously carried out with a stack of crucibles, according to the Stockbarger-Bridgman method, i.e. that in its context, the controlled cooling of the molten mixture (for growing the (mono) crystals) is obtained by very slowly moving a stack of loaded crucibles from the top to the bottom, from a hot zone to a cold zone, of an oven having a vertical axis.

The process of the invention is very advantageously carried out according to the improved Stockbarger-Bridgman method, as described in the French patent application FR 00 03 771 (Mar. 24, 2000) not published as yet, i.e. with a translatory motion of the stack of loaded crucibles, continuously, the operations of loading of said crucibles being carried out without stopping the translatory motion (along the vertical axis) of the stack of crucibles.

Said process of the invention is classically carried out with starting material in the form of a powder, especially a synthetic powder (e.g. $CaF_2$). It may also advantageously be carried out with starting material which intervenes in the form of beads. Such alkali metal or alkaline-earth metal fluoride beads, their preparation and their use for preparing monocrystals are described in French patent application FR-A-2,799,194.

The person skilled in the art has understood perfectly that the presently claimed invention provides an advantage as regards the purity of the crystal prepared, that said crystal be obtained in a mono- or polycrystalline form.

The process of the invention is advantageously carried out for preparing (mono)crystals of calcium fluoride ($CaF_2$), in the presence of $PbF_2$ (fluorinating agent); said calcium fluoride (starting material) containing calcium oxide (CaO) as impurity.

Alternatively the process of the invention is advantageously carried out for preparing (mono)crystals of calcium fluoride ($CaF_2$), in the presence of $CF_4$ (gaseous fluorinating agent) said calcium fluoride (starting material) containing calcium oxide (CaO) as impurity.

This advantageous variant of implementation of the process of the invention is illustrated by the following Examples.

EXAMPLE I

The Stockbarger-Bridgman process was carried out, starting with synthetic $CaF_2$ powder, under the same conditions, in using graphite crucibles (stacks of such crucibles) the graphites (type A to D) not having the same characteristics. The characteristics in question—density, porosity, average pore diameter, permeability—are indicated in Table I below.

The crucibles used had the same geometry (cylindrical) and the same dimensions: 200 mm diameter for 50 mm height.

The process of the invention was carried out with crucibles in graphite of type C and D.

Upon completion of the implementation of the process, the crystals obtained were analysed chemically with the view to determining their lead (Pb) content.

Said lead content is indicated in said Table I below (last line).

The presence of lead, within the crystals prepared in the crucibles in graphite of type A and B, was further confirmed by examination of the absorption band at 205 nm. In the same way, the <<absence >> of lead (the absence of said absorption band) within the crystals prepared in the crucibles in graphite of type C and D was confirmed.

It emerges without ambiguity from the consideration of the values indicated in said Table I that the more the graphite is permeable, the lower the residual lead content is. The crystals obtained in the crucibles in graphite of type A and B are not acceptable (due to their residual lead content, which is too high).

These results were not foreseeable in the light of the prior art teaching.

Thus, the inventors have themselves carried out considerable experimental work before identifying the critical parameter—the intrinsic permeability of the material constituting the crucible, the dimensions of said crucible being fixed—. The inventors have especially demonstrated that the means of implementation of the heating cycle (with the view to obtaining the melting of the starting material) was not itself critical. This is the subject of the Comparative Example below.

TABLE I

| Graphite | A | B | C | D |
|---|---|---|---|---|
| Density (g/cm$^3$) | 1.745 | 1.723 | 1.704 | 1.590 |
| Porosity (Hg) (%) | 15.8 | 16.1 | 16.7 | 22.6 |
| Average pore diameter ($\mu$m) | 2.2 | 19.1 | 6 | 21 |
| Permeability (cm$^2$/s) | 0.13 | 2.6 | 4.6 | 14.7 |
| Pb content (ppm) | 1,000 to 1,500 | 5 to 20 | <0.2* | <0.2* |

*below the limit of detection.

EXAMPLE II

Graphite crucibles, having the dimensions indicated in Example I, of type A and C were used (in stacks) to prepare crystals according to the Stockbarger-Bridgman method. Said method was carried out with different temperature rise cycles which are specified in Table II below.

It is seen that the results, in terms of pollution (lead content of the crystals prepared), are not linked to the means of implementation of the heating, but only to the nature of the graphite constituting the crystallisation crucibles.

Preferably the increased far-ultraviolet transmission fluoride optical crystal producing graphite crucible is comprised of a graphite having a permeability of which, measured according to the DIN 51935 Standard, is greater than 4 cm$^2$/s. Preferably the graphite permeability is greater than 5 cm$^2$/s, more preferably greater than 6 cm$^2$/s, more preferably greater than 7 cm$^2$/s, more preferably greater than 8 cm$^2$/s, more preferably greater than 9 cm$^2$/s, more preferably greater than 10 cm$^2$/s, more preferably greater than 11 cm$^2$/s, more preferably greater than 12 cm$^2$/s., more preferably greater than 13 cm$^2$/s, more preferably greater than 14 cm$^2$/s. Preferably the increased far-ultraviolet transmission fluoride optical crystal producing graphite crucible is comprised of a graphite having a Hg porosity of at least 16.7%, more preferably at least 17%, more preferably at least 18%, more preferably at least 19%, and more preferably a Hg porosity of at least 20%.

TABLE II

| | ① (low temperature) | ② (high temperature) |
|---|---|---|
| Temperature rise cycle | 0 to 600° C., at 50° C./h<br>600 to 800° C., at 10° C./h<br>800° C., for 12 h<br>800 to 1,100° C., at 20° C./h<br>1,100 to 1,520° C., at 50° C./h | 0 to 850° C., at 50° C/h<br>850 to 1200° C., at 30° C./h<br>1,200° C., for 12 h<br>1,200° C. to 1,520° C., at 50° C./h |
| Graphite A | Presence of lead | Presence of lead |
| Graphite C | No lead | No lead |

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A process of preparing a fluoride optical crystal comprising:
    loading a crucible with a mixture of a fluoride optical crystal starting material which contains at least one oxide as impurity, and an effective and non-excess amount of at least one fluorinating agent which is solid at ambient temperature,
    melting said mixture within said crucible,
    growing the crystal, by controlled cooling of the molten mixture,
    controlled cooling of said crystal to ambient temperature, and
    recovering said crystal;
    said process being characterised in that the oxide(s) resulting from the reaction between said fluorinating agent(s) and said oxide(s), the impurity or impurities, can be discharged from said crucible, in view of the dimensions of said crucible and of the intrinsic permeability of the material constituting it.

2. The process according to claim 1, characterised in that said effective and non-excess amount of fluorinating agent(s) represents 5% by weight at most, advantageously between 0.1 and 2% by weight, of the weight of said starting material.

3. The process according to one of claims 1 or 2, characterised in that said fluorinating agent(s) is (are) selected from PbF$_2$, ZnF$_2$, NH$_4$F, NH$_4$F.HF, PTFE, and mixtures thereof.

4. The process according to claim 1, characterised in that said crucible is a graphite crucible the permeability of which, measured according to the DIN 51935 Standard, is greater than 4 cm$^2$/s.

5. The process according to claim 1, characterised in that said crucible is a graphite crucible the permeability of which, measured according to the DIN 51935 Standard, is greater than 10 cm$^2$/s.

6. The process according to claim 1 characterised in that said crucible is suitable for preparing a fluoride optical crystal with a diameter $\geq$200 mm and a height $\geq$50 mm.

7. The process according to claim 1, characterised in that it is carried out for preparing monocrystals of alkali metal fluorides.

8. The process according to claim 1, characterised in that it is carried out for preparing monocrystals of alkaline-earth metal fluorides.

9. The process according to claim 1, characterised in that it is carried out for preparing monocrystals of CaF$_2$.

10. The process according to claim 1 characterised in that controlled cooling of the molten mixture, for growing the (mono)crystals, is obtained by very slowly moving a stack of loaded crucibles from the top to the bottom, from a hot zone to a cold zone, of an oven having a vertical axis.

11. A method of making a calcium fluoride crystal with increased far-ultraviolet transmission, said method comprising:
    providing a calcium fluoride crystal producing graphite crucible for containing calcium fluoride, said graphite crucible comprised of a graphite having a permeability of which, measured according to the DIN 51935 Standard, is greater than 4 cm$^2$/s
    forming a molten calcium fluoride melt in said graphite crucible comprised of said graphite having a permeability greater than 4 cm$^2$/s
    forming a calcium fluoride crystal from said molten calcium fluoride melt, said formed calcium fluoride crystal having an increased far-ultraviolet transmission with intrinsic transmission at 193 nm≧99.9% and intrinsic transmission at 157 nm≧99%.

12. A method as claimed in claim 11 wherein said graphite crucible is comprised of a graphite having a permeability of which, measured according to the DIN 51935 Standard, is greater tan 5 cm$^2$/s.

13. A method as claimed in claim 11 wherein said graphite crucible is comprised of a graphite having a permeability of which, measured according to the DIN 51935 Standard, is greater than 6 cm$^2$/s.

14. A method as claimed in claim 11 wherein said graphite crucible is comprised of a graphite having a permeability of which, measured according to the DIN 51935 Standard, is greater than 7 cm$^2$/s.

15. A method as claimed in claim 11 wherein said graphite crucible is comprised of a graphite having a permeability of which, measured according to the DIN 51935 Standard, is greater than 8 cm$^2$/s.

16. A method as claimed in claim 11 wherein said graphite crucible is comprised of a graphite having a permeability of which, measured according to the DIN 51935 Standard, is greater than 9 cm$^2$/s.

17. A method as claimed in claim 11 wherein said graphite crucible is comprised of a graphite having a permeability of which, measured according to the DIN 51935 Standard, is greater than 10 cm$^2$/s.

18. A method as claimed in claim 11 wherein said graphite crucible is comprised of a graphite having a permeability of which, measured according to the DIN 51935 Standard, is greater than 11 cm$^2$/s.

19. A method as claimed in claim 11 wherein said graphite crucible is comprised of a graphite having a permeability of which, measured according to the DIN 51935 Standard, is greater than 12 cm$^2$/s.

20. A method as claimed in claim 11 wherein said graphite crucible is comprised of a graphite having a permeability of which, measured according to the DIN 51935 Standard, is greater than 13 cm$^2$/s.

21. A method as claimed in claim 11 wherein said graphite crucible is comprised of a graphite having a permeability of which, measured according to the DIN 51935 Standard, is greater than 14 cm$^2$/s.

22. A method as claimed in claim 11 wherein said graphite crucible is comprised of a graphite having a Hg porosity of at least 16.7%.

23. A method as claimed in claim 11 wherein said graphite crucible is comprised of a graphite having a Hg porosity of at least 20%.

* * * * *